(12) United States Patent
Yasunaga et al.

(10) Patent No.: US 9,308,546 B2
(45) Date of Patent: Apr. 12, 2016

(54) DISCHARGE SURFACE TREATMENT APPARATUS

(75) Inventors: Yusuke Yasunaga, Tokyo (JP); Akihiro Goto, Tokyo (JP); Hiroyuki Teramoto, Tokyo (JP); Nobuyuki Sumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 394 days.

(21) Appl. No.: 13/824,867

(22) PCT Filed: Jun. 5, 2012

(86) PCT No.: PCT/JP2012/064469
§ 371 (c)(1),
(2), (4) Date: Mar. 18, 2013

(87) PCT Pub. No.: WO2013/183116
PCT Pub. Date: Dec. 12, 2013

(65) Prior Publication Data
US 2013/0319324 A1    Dec. 5, 2013

(51) Int. Cl.
*B05C 11/00* (2006.01)
*H01J 37/32* (2006.01)
*H05H 1/46* (2006.01)

(52) U.S. Cl.
CPC .............. *B05C 11/00* (2013.01); *H01J 37/3255* (2013.01); *H01J 37/32577* (2013.01); *H01J 37/32614* (2013.01); *H01J 37/32825* (2013.01); *H05H 1/46* (2013.01); *H05H 2001/4682* (2013.01)

(58) Field of Classification Search
CPC .. B05C 11/00; H01J 37/3255; H01J 37/3257; H01J 37/32614; H01J 37/32825; H05H 1/46; H05H 2001/4682
See application file for complete search history.

(56) References Cited

U.S. PATENT DOCUMENTS 3,548,142 A    12/1970   Sennowitz
6,423,920 B1 *  7/2002   Kaneko et al. ............. 219/69.18
(Continued)

FOREIGN PATENT DOCUMENTS

CN    1286731 A    3/2001
CN    101048253 A   10/2007
(Continued)

OTHER PUBLICATIONS

Machine translation of Japan Patent document No. 2005-213,554, May 2015.*

(Continued)

*Primary Examiner* — Geoffrey S Evans
(74) *Attorney, Agent, or Firm* — Sughrue Mion, PLLC; Richard C. Turner

(57) ABSTRACT

A discharge surface treatment apparatus generates a pulsed discharge between poles, that is, between a discharge electrode and a workpiece, and the discharge electrode is obtained by compression-molding of any one of a metal powder, a powder of a metal compound, and a powder of ceramics or a mixture thereof. The apparatus forms a film made of an electrode material or the like on a workpiece surface by thermal energy due to the discharge. The apparatus includes: a capacitor that is connected to any one of the discharge electrode and the workpiece at one end; and a parallel circuit of a resistor and a diode, which is provided between another one of the discharge electrode and the workpiece and another end of the capacitor via a connection line.

8 Claims, 8 Drawing Sheets

(56) References Cited

U.S. PATENT DOCUMENTS

| | | | |
|---|---|---|---|
| 6,702,896 B1 * | 3/2004 | Inoue et al. | 118/638 |
| 6,783,795 B2 | 8/2004 | Inoue et al. | |
| 7,067,011 B2 | 6/2006 | Inoue et al. | |
| 7,323,213 B2 | 1/2008 | Inoue et al. | |
| 7,645,958 B2 | 1/2010 | Oda et al. | |
| 2004/0055881 A1 * | 3/2004 | Christie | H01J 37/34 204/298.08 |
| 2004/0086657 A1 | 5/2004 | Inoue et al. | |
| 2005/0079276 A1 * | 4/2005 | Inoue | C25D 21/12 427/8 |
| 2006/0204669 A1 | 9/2006 | Inoue et al. | |
| 2006/0213777 A1 * | 9/2006 | Goto | C23C 26/00 205/83 |
| 2008/0017614 A1 * | 1/2008 | Oda et al. | 219/69.13 |
| 2013/0344651 A1 * | 12/2013 | Nakano | H01J 37/32559 438/105 |

FOREIGN PATENT DOCUMENTS

| | | | |
|---|---|---|---|
| DE | 2028353 B2 | | 5/1971 |
| JP | 57-194823 A | | 11/1982 |
| JP | 59-182024 A | * | 10/1984 |
| JP | 61-260919 A | | 11/1986 |
| JP | 61-260923 A | * | 11/1986 |
| JP | 6-312316 A | * | 11/1994 |
| JP | 2005-213554 A | * | 8/2005 |
| JP | 2005-213554 A | | 8/2005 |
| WO | 99/58743 A1 | | 11/1999 |
| WO | 01/51240 A1 | | 7/2001 |
| WO | 2006/046599 A1 | | 5/2006 |

OTHER PUBLICATIONS

Machine translation of Japan Patent document No. 6-312,316, May 2015.*

Communication dated Jun. 17, 2015 from the German Patent Office in counterpart application No. 11 2012 006 467.4.

Communication dated Jan. 5, 2015, issued by the State Intellectual Property Office of P.R. China in counterpart Chinese application No. 201280002957.9.

* cited by examiner

1···DISCHARGE ELECTRODE
2···WORKPIECE
7···MACHINING FLUID

1···DISCHARGE ELECTRODE
2···WORKPIECE
7···MACHINING FLUID

1···DISCHARGE ELECTRODE
2···WORKPIECE
7···MACHINING FLUID

1···DISCHARGE ELECTRODE
2···WORKPIECE
7···MACHINING FLUID

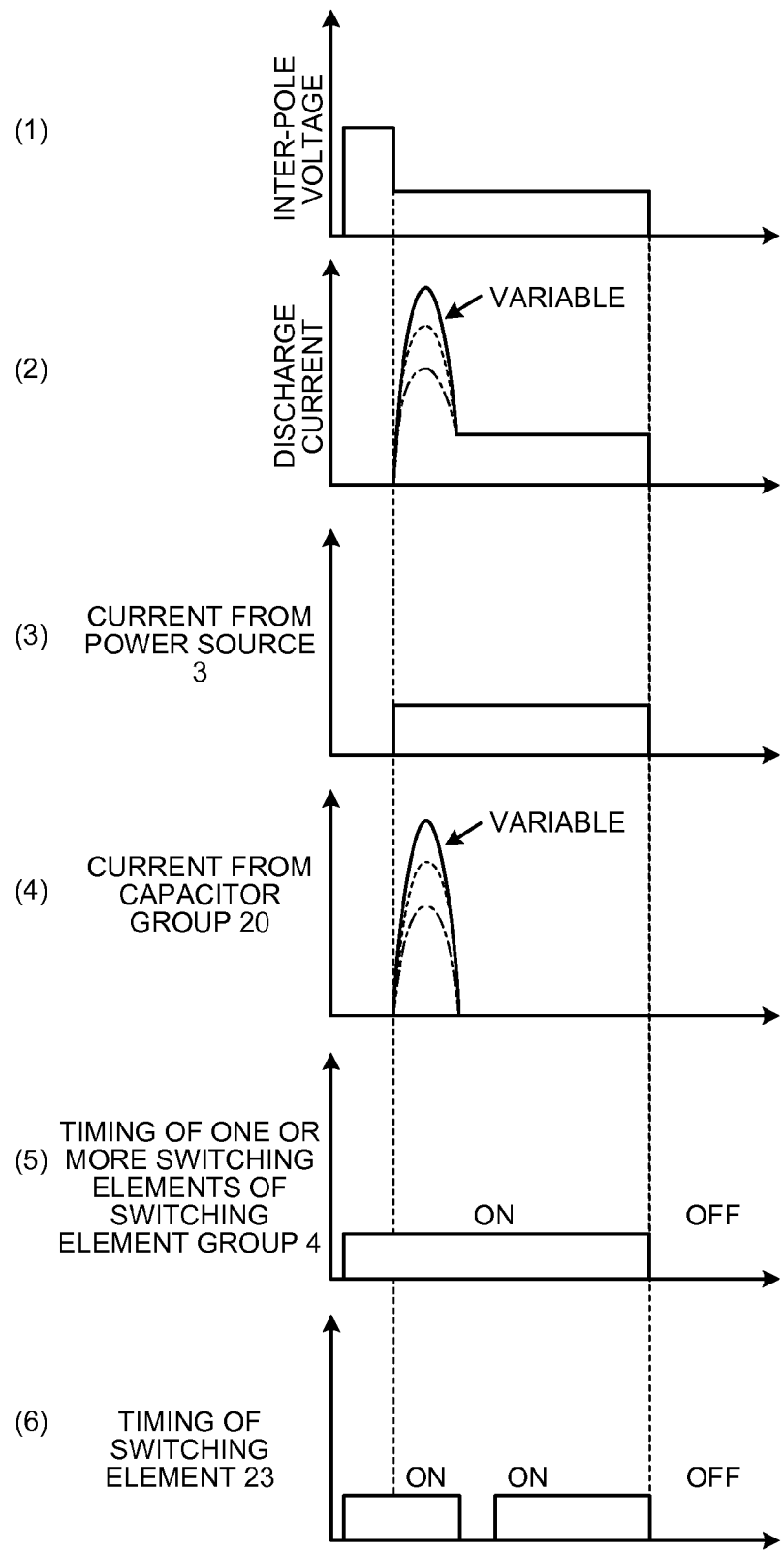

DISCHARGE SURFACE TREATMENT APPARATUS

CROSS REFERENCE TO RELATED APPLICATIONS

This application is a National Stage of International Application No. PCT/JP2012/064469 filed Jun. 5, 2012, the contents of all of which are incorporated herein by reference in their entirety.

FIELD

The present invention relates to a discharge surface treatment apparatus that forms a film on a surface of a process target member (workpiece) by using an electrical discharge machining technology.

BACKGROUND

A discharge surface treatment apparatus is an apparatus that generates a pulsed discharge between poles, i.e., between a discharge electrode and a workpiece to form a film made of an electrode material melted by the thermal energy due to the discharge or a substance resultant from the reaction of the electrode material by the thermal energy due to the discharge on the surface of the workpiece. The discharge electrode is obtained by compression-molding of any one of a metal powder, a powder of a metal compound, and a powder of ceramics or a mixture thereof.

The workpiece is, for example, a component used under a high temperature environment, such as a turbine blade in an aircraft gas-turbine engine. For example, for repairing a component of this type used under a high temperature environment, the surface needs to be coated or built-up with a material having strength and lubricity under a high temperature environment, and the discharge surface treatment apparatus is used.

In order to form a dense and thick film by the discharge surface treatment, it is necessary that: the supply of the electrode material to a portion between the poles and subsequent supply of the electrode material to a workpiece surface by a discharge pulse current are adequate; and the supplied electrode material is melted by the discharge pulse current and is strongly bonded to the workpiece surface.

For example, Patent Literature 1 proposes a discharge surface treatment apparatus that can form a dense and relatively thick film by generating a discharge pulse current satisfying the above conditions between the poles. Specifically, Patent Literature 1 illustrates a configuration in which a capacitor is connected in parallel with a discharge electrode and a workpiece as a configuration that generates the discharge pulse current satisfying the above conditions between the poles.

With this configuration, the capacitor is charged by a no-load voltage applied between the poles from a power source. When a discharge occurs: first, a discharge current having a high peak value and short pulse width, which is obtained by adding current from the capacitor to current supplied from the power source, flows between the poles; subsequently, a discharge current having a low current value and long pulse width, which is composed only of current supplied from the power source, flows. In this manner, as the capacitor is connected in parallel with the discharge electrode and the workpiece, a discharge pulse current having a shape of a "high peak value and short pulse width"+"low current value and long pulse width" may be caused to flow between the poles.

In accordance with the discharge pulse current having a shape of a "high peak value and short pulse width"+"low current value and long pulse width", in the leading current portion having a "high peak value and short pulse width", the electrode disintegrates and the supply of the electrode material to a portion between the poles is controlled. In the subsequent current portion having a "low current value and long pulse width", part of the electrode material is melted by the thermal energy due to the discharge and a film is formed on the workpiece surface.

However, at the boundary between the leading pulse current portion and the subsequent pulse current portion, charging of the capacitor is started by a discharge voltage between the poles, therefore, there is a problem in that reversal of the output current direction occurs and a portion having a low output current is generated. Particularly, when the current supplied from the power source is low, a phenomenon may occur in which the discharge current is interrupted at the portion at which reversal of the output current direction occurs. When the discharge current is interrupted in the middle of the process, the necessary discharge thermal energy cannot be obtained and therefore, the electrode material is not melted completely, which results in the formation of the film having a large number of voids and defects.

In order to solve this problem, if the above capacitor is referred to as a first capacitor, Patent Literature 1 proposes a configuration in which a second capacitor is arranged in parallel with the first capacitor and current is supplied from the second capacitor after the occurrence of a discharge, thereby preventing the discharge current from being interrupted due to reversal of the output current direction in the first capacitor.

However, with the configuration in which the first capacitor and the second capacitor are arranged in parallel between the poles, the peak current from the first capacitor and the peak current from the second capacitor are superimposed, therefore, in the leading current portion having a "high peak value and short pulse width" serving to melt the electrode, the current value partially increases. If the current value partially increases in the part of the leading current portion having a "high peak value and short pulse width", the thermal energy that melts part of the electrode material increases excessively, and the electrode material cannot smoothly move to the film side and thus works to remove the film, thereby forming a film having a large number of voids and defects.

CITATION LIST

Patent Literature

Patent Literature 1: Japanese Patent Application Laid-open No. 2005-213554

SUMMARY

Technical Problem

In other words, in the conventional technology, the waveform of a discharge pulse current that includes a current portion having a high peak value and short pulse width in the leading portion cannot be formed into a current waveform that does not affect the formation of the film.

The present invention is made in view of the above and has an object to obtain a discharge surface treatment apparatus capable of forming the waveform of a discharge pulse current into a current waveform that does not affect the formation of the film when a capacitor is connected in parallel with a discharge electrode and a workpiece and a current portion having a high peak value and short pulse width is formed in the leading portion of the discharge pulse current generated between the poles.

Solution to Problem

To solve the above described problem and achieve the object, a discharge surface treatment apparatus that: generates a pulsed discharge between poles, that is, between a discharge electrode and a workpiece, wherein the discharge electrode is obtained by compression-molding of any one of a metal powder, a powder of a metal compound, and a powder of ceramics or a mixture thereof; and forms a film made of an electrode material or the like on a workpiece surface by thermal energy due to the discharge, includes: a capacitor that is connected to any one of the discharge electrode and the workpiece at one end; and a parallel circuit of a resistor and a diode, which is provided between another one of the discharge electrode and the workpiece and another end of the capacitor via a connection line.

Advantageous Effects of Invention

According to the present invention, around the boundary between the leading current portion having a high peak value and short pulse width and the subsequent pulse current portion having a low current value and long pulse width, a reverse current due to reversal of the output current direction that occurs in the capacitor can be suppressed or blocked. Therefore, it is possible to prevent a discharge pulse current from being interrupted around the boundary between the leading current portion having a high peak value and short pulse width and the subsequent current portion having a low current value and long pulse width. Moreover, the current value does not become locally different in the leading current portion having a high peak value and short pulse width. Therefore, an effect can be obtained where the waveform of the entire discharge pulse current, which is generated between the poles and includes a current portion having a high peak value and short pulse width in the leading portion, can be formed into a current waveform that does not affect the formation of the film.

BRIEF DESCRIPTION OF DRAWINGS

FIG. 9 is a waveform chart explaining the operation of the main portion configuration of the discharge surface treatment apparatus shown in FIG. 8.

DESCRIPTION OF EMBODIMENTS

Embodiments of a discharge surface treatment apparatus according to the present invention will be explained below in detail with reference to the drawings. This invention is not limited to the embodiments.

First Embodiment

Figure 1:
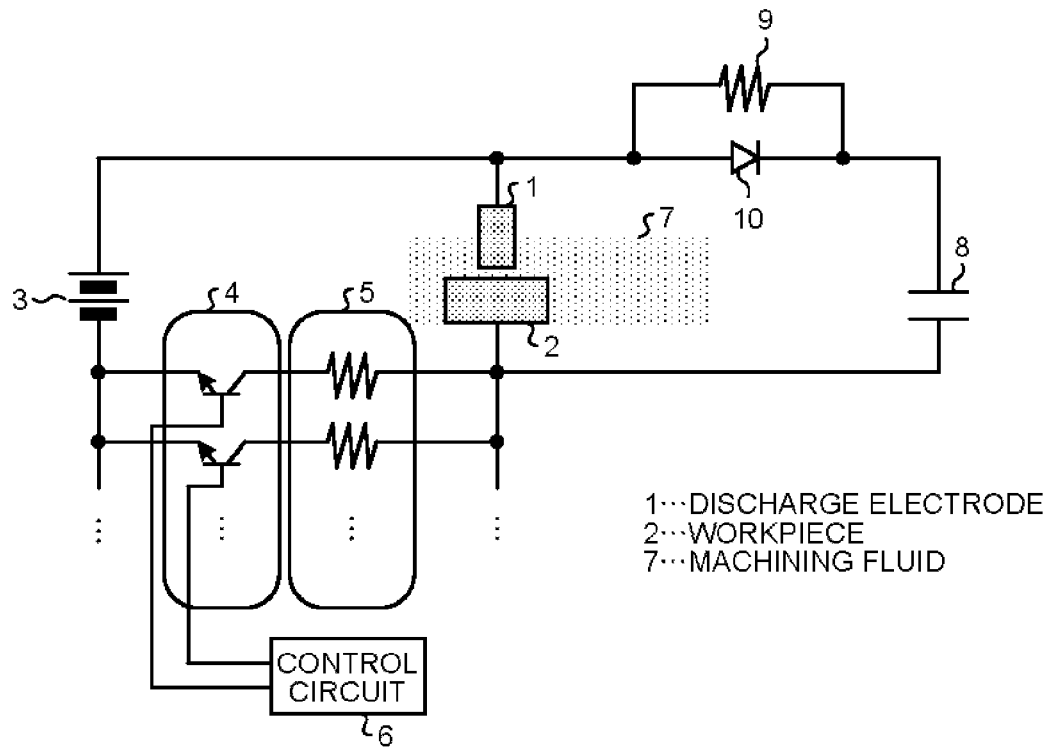
FIG. 1 is a circuit diagram illustrating a main portion configuration of a discharge surface treatment apparatus according to a first embodiment of the present invention.

FIG. 1 is a circuit diagram illustrating a main portion configuration of a discharge surface treatment apparatus according to the first embodiment of the present invention. FIG. 1 illustrates a circuit (first example) that can form a discharge pulse current into a current waveform that does not affect the formation of the film when a capacitor is connected in parallel with a discharge electrode and a workpiece, which are spaced apart at a certain interval, and a current portion having a high peak value and short pulse width is formed in the leading portion of the discharge pulse current flowing between the poles, i.e., between the discharge electrode and the workpiece.

In FIG. 1, a discharge electrode 1 for the discharge surface treatment is a green compact obtained by compression-molding of any one of a metal powder, a powder of a metal compound, and a powder of ceramics or a mixture thereof. A workpiece 2 that is a process target member is a component that needs to be coated or built-up with a material having strength and lubricity under a high temperature environment.

The positive electrode terminal of a power source 3 is directly connected to the discharge electrode 1. The negative electrode terminal of the power source 3 is connected to the workpiece 2 via a series circuit including a switching element group 4 that includes a plurality of switching elements arranged in parallel and a resistor group 5 in which resistors, the number of which is the same as that of the switching elements, are arranged in parallel. Each switching element of the switching element group 4 is individually controlled so as to be turned on and off from a control circuit 6. Consequently, each switching element of the switching element group 4 constitutes a discharge pulse generating unit.

Moreover, the discharge electrode 1 is connected to one end of a capacitor 8 via a parallel circuit of a resistor 9 and a diode 10. The diode 10 is connected to the discharge electrode 1 at the anode terminal and is connected to one end of the capacitor 8 at the cathode terminal. The other end of the capacitor 8 is directly connected to the workpiece 2.

FIG. 1 illustrates the case where the discharge electrode 1 and the workpiece 2 are arranged in a machining fluid 7, however, they may be arranged in the air in some cases.

Figure 2:
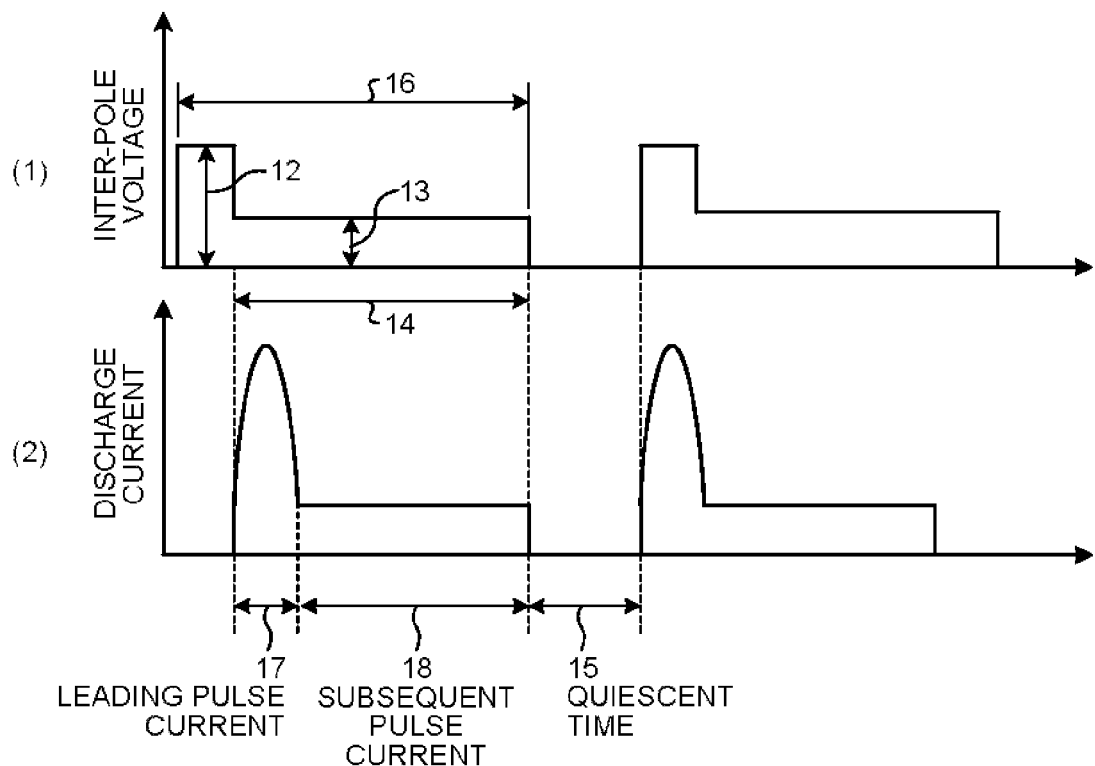
FIG. 2 is a waveform chart explaining the principle relationship between a pulse voltage applied between poles and a discharge pulse current flowing between the poles.
Figure 3:
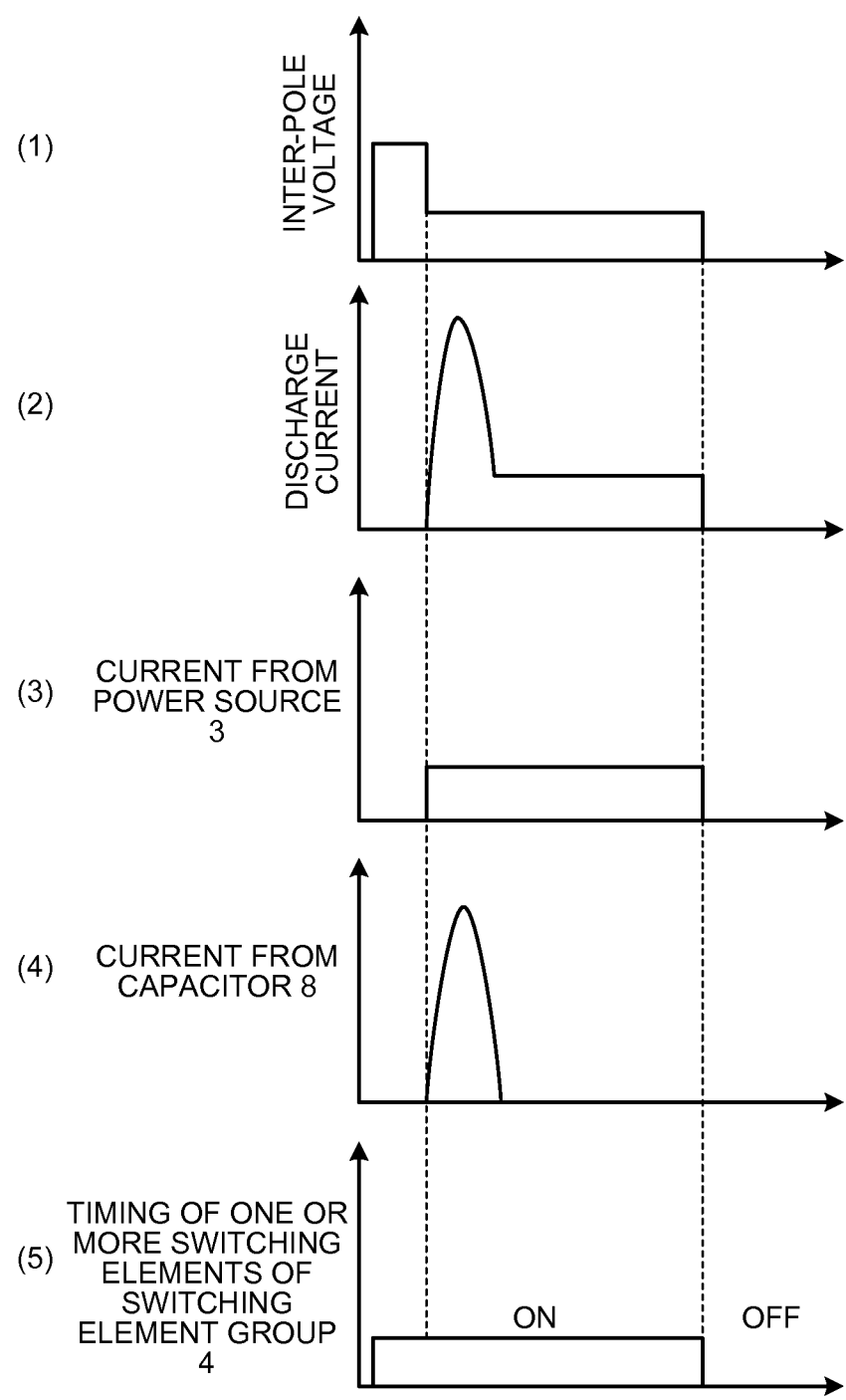
FIG. 3 is a waveform chart explaining the operation of the main portion configuration of the discharge surface treatment apparatus shown in FIG. 1.

Next, the operation of the components related to the first embodiment will be explained with reference to FIG. 1 to FIG. 3. FIG. 2 is a waveform chart explaining the principle relationship between a pulse voltage applied between the poles and a discharge pulse current flowing between the poles. FIG. 3 is a waveform chart explaining the operation of the main portion configuration of the discharge surface treatment apparatus shown in FIG. 1. FIG. 3 illustrates (1) interpole voltage, (2) discharge current, (3) current from the power source 3, (4) current from the capacitor 8, and (5) timing of one or more switching elements of the switching element group 4.

FIG. 2 (1) illustrates the control operation content of the control circuit 6. When the control circuit 6 turns on one or more switching elements of the switching element group 4, the output voltage of the power source 3 is applied between the poles, i.e., between the discharge electrode 1 and the workpiece 2. When a certain period of time has elapsed in this state and a discharge occurs between the poles, the inter-pole voltage decreases to a discharge voltage 13 from a no-load voltage 12 before the discharge. The control circuit 6 keeps the one or more switching elements of the switching element group 4 on until a predetermined time 14 elapses from the time at which the inter-electrode voltage decreases from the no-load voltage 12 to the discharge voltage 13. When the predetermined time 14 has elapsed, the control circuit 6 turns off the one or more switching elements of the switching element group 4 that are on for a predetermined time to form a pause time 15. When the pause time 15 is finished, the control circuit 6 turns on one or more switching elements of the switching element group 4 again. The control circuit 6 repeats the above operation. A pulse voltage having a pulse width of a period 16, in which one or more switching elements of the switching element group 4 are on, is repeatedly applied between the poles with the pause time 15 therebetween.

As illustrated in FIG. 2 (2), a discharge pulse current having a pulse width of the predetermined time 14 flows between the poles until the predetermined time 14, which is the time from when the inter-pole voltage decreases from the no-load voltage 12 to the discharge voltage 13 to when one or more switching elements of the switching element group 4 that are on are turned off, elapses. This discharge pulse current is composed of a leading pulse current 17 and a subsequent pulse current 18. The leading pulse current 17 is a current component having a high peak value and short pulse width and the subsequent pulse current 18 is a current component having a low current value and long pulse width.

The leading pulse current 17 having a high peak value and short pulse width is generated because the capacitor 8 is provided and the action of the capacitor 8 is illustrated in FIG. 3. Specifically, when one or more switching elements of the switching element group 4 are turned on and the voltage is applied between the poles from the power source 3, the capacitor 8 is charged via the resistor 9. When a discharge occurs, first, the leading pulse current 17 (FIG. 2) having a high peak value and short pulse width obtained by adding the current (FIG. 3 (4)) from the capacitor 8 to the current (FIG. 3 (3)) supplied from the power source 3 flows between the poles, which is followed by the subsequent pulse current 18 (FIG. 2) having a low current value and long pulse width composed of only the current (FIG. 3 (3)) supplied from the power source 3.

In this case, in a portion in which the subsequent pulse current 18 having a "low current value and long pulse width" starts to flow, reversal of the current direction occurs in the capacitor 8. However, the reverse current is blocked by the diode 10 and is suppressed by the resistor 9. Therefore, as shown in FIG. 3 (2) and (4), the problem of generating a portion in which the output current is low, in the current portion where the current is switched from the leading pulse current 17 to the subsequent pulse current 18, does not occur.

In other words, it is possible to suppress the phenomenon of the discharge current being interrupted in the middle of process as in the conventional technology. Moreover, the current value is prevented from being locally different in the leading current portion having a high peak value and short pulse width. Therefore, the discharge pulse current having an appropriate current waveform that does not affect the formation of the film can be supplied between the poles. Thus, a dense film can be formed.

In the period of the subsequent pulse current 18, charging of the capacitor 8 is performed via the resistor 9 for preparing for the next cycle. If the resistance value of the resistor 9 is high, the effect of suppressing the reverse current of the capacitor 8 becomes high, however, charging of the capacitor 8 is hindered, therefore, there is a problem in that the charging time becomes long. Thus, the resistance value of the resistor 9 is set between about 10 and 100Ω so that the reverse current of the capacitor 8 is suppressed and the charging time is not affected.

For example, International Publication Number WO 2006/046599 describes a method of suppressing a pulse in the negative electrode direction in an alternating current pulse of both positive and negative polarity. However, this circuit is for suppressing a negative polarity current of an alternating current, therefore, charging of a capacitor is not considered. Moreover, the circuit is configured so that pulses are not connected. Therefore, this circuit is different from the circuit that generates the leading pulse current 17 having a high peak value and short pulse width in combination with the subsequent pulse current 18 having a low current value and long pulse width according to the present embodiment.

Second Embodiment

Figure 4:
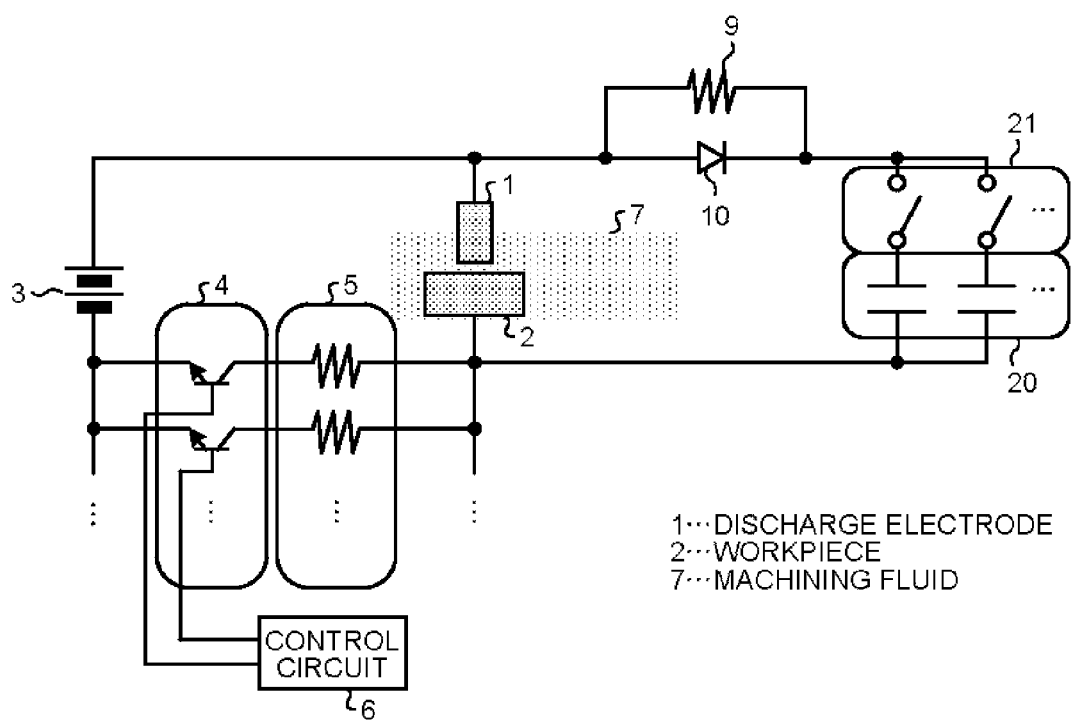
FIG. 4 is a circuit diagram illustrating a main portion configuration of a discharge surface treatment apparatus according to a second embodiment of the present invention.

FIG. 4 is a circuit diagram illustrating a main portion configuration of a discharge surface treatment apparatus according to the second embodiment of the present invention. In FIG. 4, components that are the same as or similar to the components illustrated in FIG. 1 (first embodiment) are denoted by the same reference numerals. In this embodiment, the components related to the second embodiment will be mainly explained.

In FIG. 4: a capacitor is connected in parallel with a discharge electrode and a workpiece which are arranged apart with a space at a certain interval; when forming a current portion having a high peak value and short pulse width in the leading portion of the discharge pulse current flowing between the poles, i.e., between the discharge electrode and the workpiece; as a circuit (second example) that can form a discharge pulse current into a current waveform that does not affect the formation of the film; in the configuration illustrated in FIG. 1 (first embodiment); a series circuit of a capacitor group 20 and a switch group 21 is provided instead of the capacitor 8. A plurality of capacitors is arranged in parallel in the capacitor group 20; and a plurality of switches, the number of which is the same as that of the capacitors, is arranged in parallel in the switch group 21. Other configurations are similar to that in FIG. 1.

Each switch of the switch group 21 is a transistor, a relay, or a mechanical switch. Therefore, each switch of the switch group 21 is individually controlled to be turned on and off by the control circuit 6 or manually.

Figure 5:
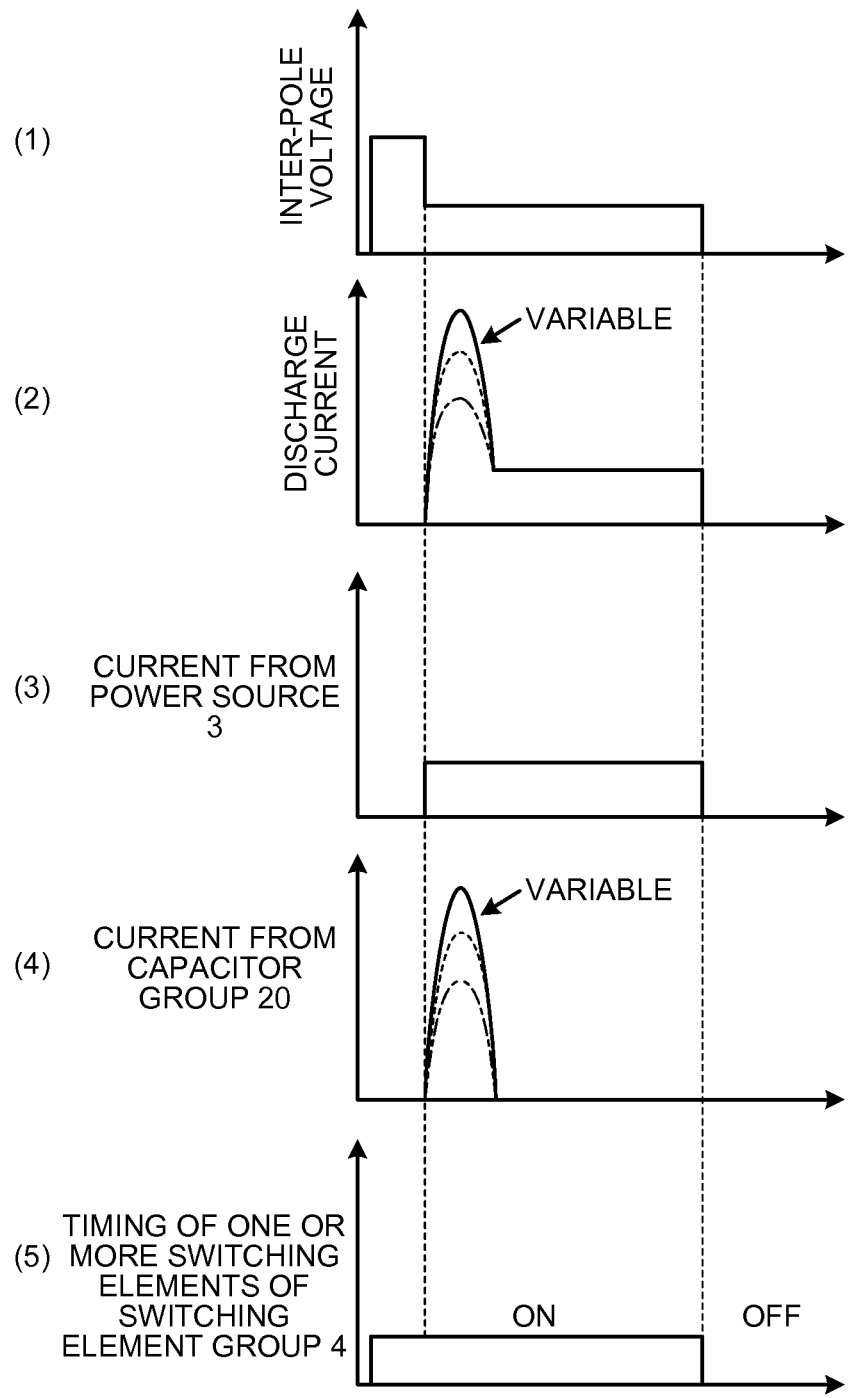
FIG. 5 is a waveform chart explaining the operation of the main portion configuration of the discharge surface treatment apparatus shown in FIG. 4.

Next, the operation of the components related to the second embodiment will be explained with reference to FIG. 2, FIG. 4, and FIG. 5. FIG. 5 is a waveform chart explaining the operation of the main portion configuration of the discharge surface treatment apparatus shown in FIG. 4. FIG. 5 illustrates (1) inter-pole voltage, (2) discharge current, (3) current from the power source 3, (4) current from the capacitor group 20, and (5) timing of one or more switching elements of the switching element group 4.

When the control circuit 6 turns on one or more switching elements of the switching element group 4 in a state where any one of the switches of the switch group 21 is on, voltage is applied between the poles from the power source 3. Then, the capacitor in the capacitor group 20 corresponding to the switch that is on in the switch group 21 is charged via the resistor 9.

When a discharge occurs, first, the leading pulse current 17 (FIG. 2) having a high peak value and short pulse width obtained by adding the current (FIG. 5 (4)) from one capacitor in the capacitor group 20 to the current (FIG. 5 (3)) supplied from the power source 3 flows between the poles, which is followed by the subsequent pulse current 18 (FIG. 2) having a low current value and long pulse width composed of only the current (FIG. 5 (3)) supplied from the power source 3.

Then, in a portion in which the subsequent pulse current 18 having a "low current value and long pulse width" starts to flow, a reverse current that is generated in the capacitor performing a charge/discharge operation in the capacitor group 20 is blocked by the diode 10 and is suppressed by the resistor 9. Therefore, as shown in FIG. 5 (2) and (4), the problem that a portion in which the output current is low is generated in the current portion where the current is switched from the leading pulse current 17 to the subsequent pulse current 18 does not occur. Moreover, the current value is prevented from being locally different in the leading current portion having a high peak value and short pulse width.

In other words, in a similar manner to the first embodiment, in the second embodiment, the discharge pulse current having an appropriate current waveform that does not affect the formation of the film can be supplied between the poles.

In addition, in the second embodiment, the number of capacitors that perform charging and discharging in the capacitor group 20 can be changed by changing the number of switches to be turned on in the switch group 21. Therefore, the capacitance value of the capacitor connected in parallel with the discharge electrode 1 and the workpiece 2 can be changed.

In other words, as shown in FIG. 5 (2) and (4), the peak value of the leading pulse current 17 having a high peak value and short pulse width can be changed Therefore, when the discharge electrode 1 is hard, the peak current can be controlled so as to be high, and, when the discharge electrode 1 is soft, the peak current can be controlled so as to be low.

Therefore, in the second embodiment, the supply of an electrode material can be made appropriate so as to flexibly correspond to various electrodes. Thus, a dense film by various electrodes can be formed.

Third Embodiment

Figure 6:
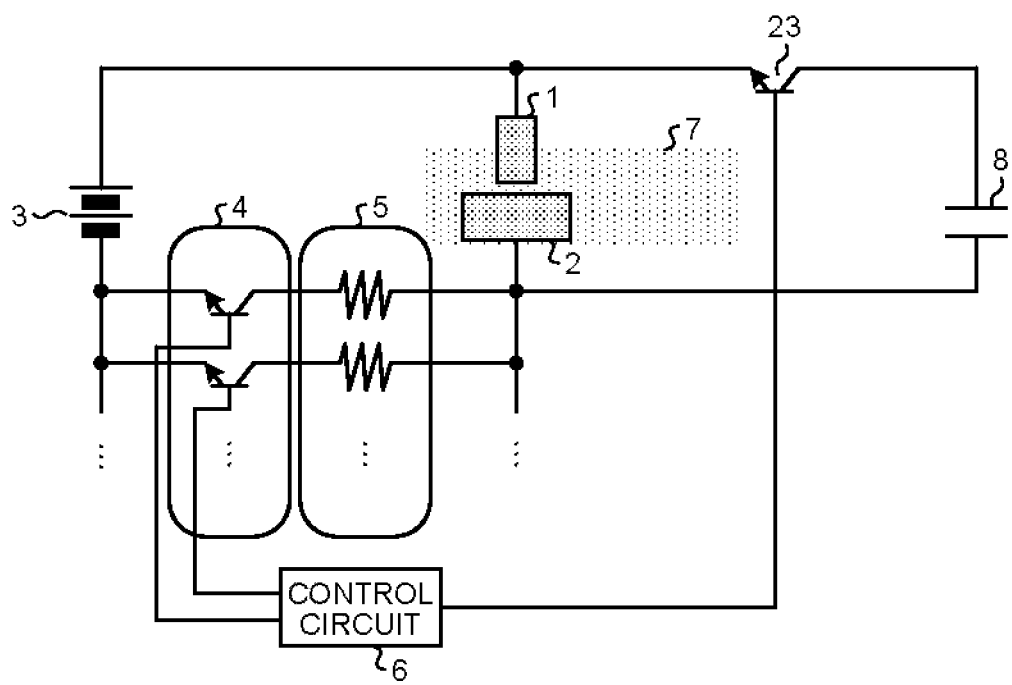
FIG. 6 is a circuit diagram illustrating a main portion configuration of a discharge surface treatment apparatus according to a third embodiment of the present invention.

FIG. 6 is a circuit diagram illustrating a main portion configuration of a discharge surface treatment apparatus according to the third embodiment of the present invention. In FIG. 6, components that are the same as or similar to the components illustrated in FIG. 1 (first embodiment) are denoted by the same reference numerals. In this embodiment, the components related to the third embodiment are mainly explained.

In FIG. 6: a capacitor is connected in parallel with a discharge electrode and a workpiece which are arranged apart with a space at a certain interval; when forming a current portion having a high peak value and short pulse width in the leading portion of the discharge pulse current flowing between the poles, i.e., between the discharge electrode and the workpiece; as a circuit (third example) that can form a discharge pulse current into a current waveform that does not affect the formation of the film; in the configuration illustrated in FIG. 1 (first embodiment); a switching element 23 is provided instead of the parallel circuit of resistor 9 and the diode 10. The switching element 23 is controlled to be turned on and off by the control circuit 6. Other configurations are similar to that in FIG. 1.

Figure 7:
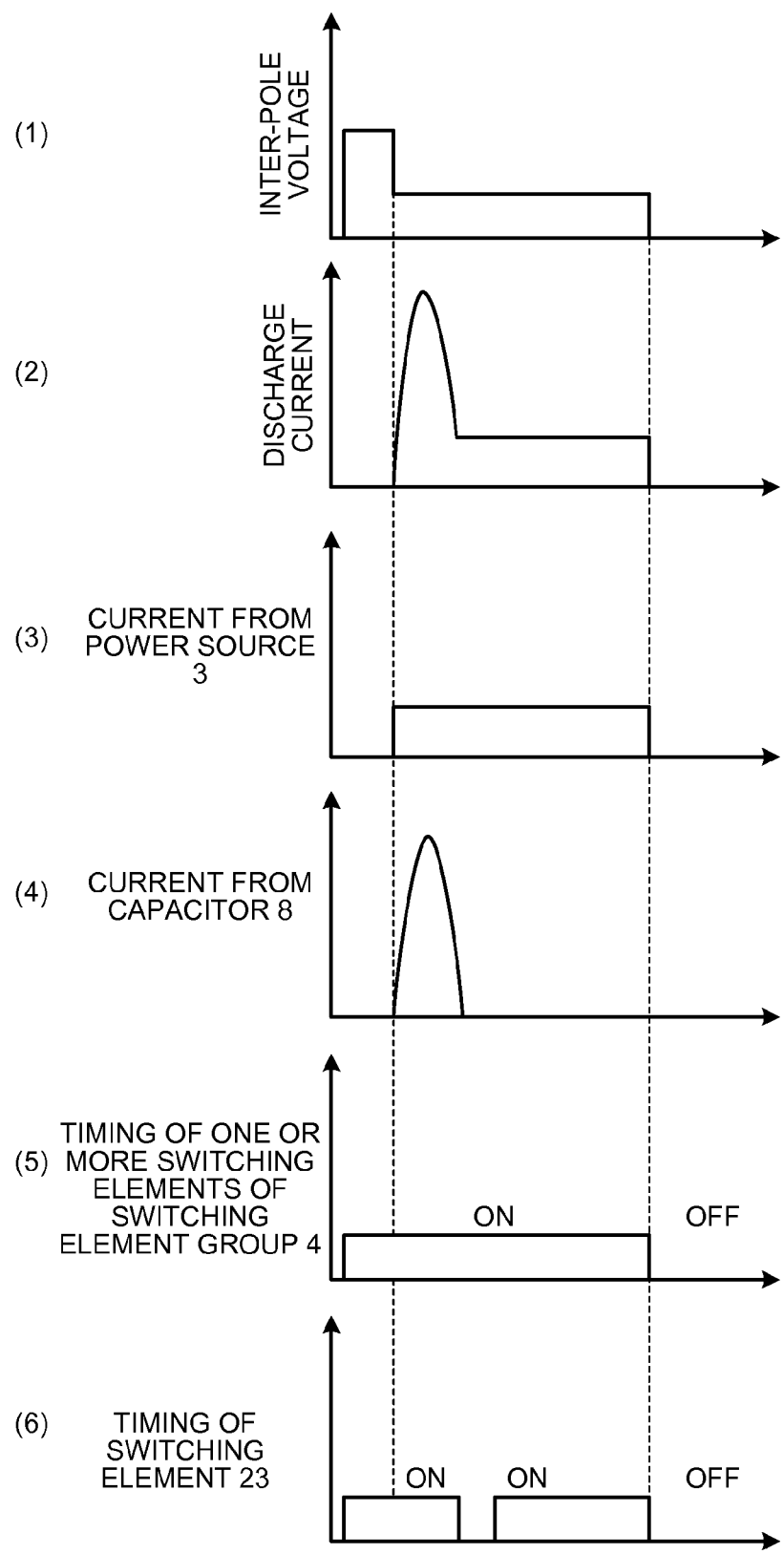
FIG. 7 is a waveform chart explaining the operation of the main portion configuration of the discharge surface treatment apparatus shown in FIG. 6.

Next, the operation of the components related to the third embodiment will be explained with reference to FIG. 2, FIG. 6, and FIG. 7. FIG. 7 is a waveform chart explaining the operation of the main portion configuration of the discharge surface treatment apparatus shown in FIG. 6. FIG. 7 illustrates (1) inter-pole voltage, (2) discharge current, (3) current from the power source 3, (4) current from the capacitor 8, (5) timing of one or more switching elements of the switching element group 4, and (6) timing of the switching element 23.

When the control circuit 6 turns on one or more switching elements of the switching element group 4 and applies the output voltage of the power source 3 between the poles, i.e., between the discharge electrode 1 and the workpiece 2, the control circuit 6 turns on the switching element 23 (FIG. 7 (5) and (6)). Consequently, the capacitor 8 is charged via the switching element 23. When a discharge occurs, first, the leading pulse current 17 (FIG. 2) having a high peak value and short pulse width obtained by adding the current (FIG. 7 (4)) from the capacitor 8 to the current (FIG. 7 (3)) supplied from the power source 3 flows between the poles, which is followed by the subsequent pulse current 18 (FIG. 2) having a low current value and long pulse width composed of only the current (FIG. 7 (3)) supplied from the power source 3.

In this case, in a portion in which the subsequent pulse current 18 having a "low current value and long pulse width" starts to flow, reversal of the current direction occurs in the capacitor 8, however, because the control circuit 6 determines in advance the timing at which the subsequent pulse current 18 starts flowing, the control circuit 6 turns off the switching element 23 at that timing and keeps the switching element 23 off for an arbitrary short period of time (FIG. 7 (6)). Therefore, even if reversal of the current direction occurs in the capacitor 8, the reverse current is blocked by the switching element 23 that is turned off. Consequently, as shown in FIG. 7 (2) and (4), the problem that a portion in which the output current is low is generated in the current portion in which the current is switched from the leading pulse current 17 to the subsequent pulse current 18 does not occur.

In other words, it is possible to suppress the phenomenon of the discharge current being interrupted in the middle of process as in the conventional technology. Moreover, the current value is prevented from being locally different in the leading current portion having a high peak value and short pulse width. Therefore, the discharge pulse current having an appropriate current waveform that does not affect the formation of the film can be supplied between the poles. Thus, a dense film can be formed.

In the period of the subsequent pulse current 18, in order to enable charging of the capacitor 8 to be performed for preparing for the next cycle, the control circuit 6 turns on the switching element 23 that is turned off after the lapse of an arbitrary period of time (FIG. 7 (6)); and keeps the switching element 23 on until turning off one or more switching elements of the switching element group 4 (FIG. 7 (5) and (6)). Consequently, the charging time of the capacitor 8 does not become long and thus sufficient charging can be completed in a short time.

Fourth Embodiment

Figure 8:
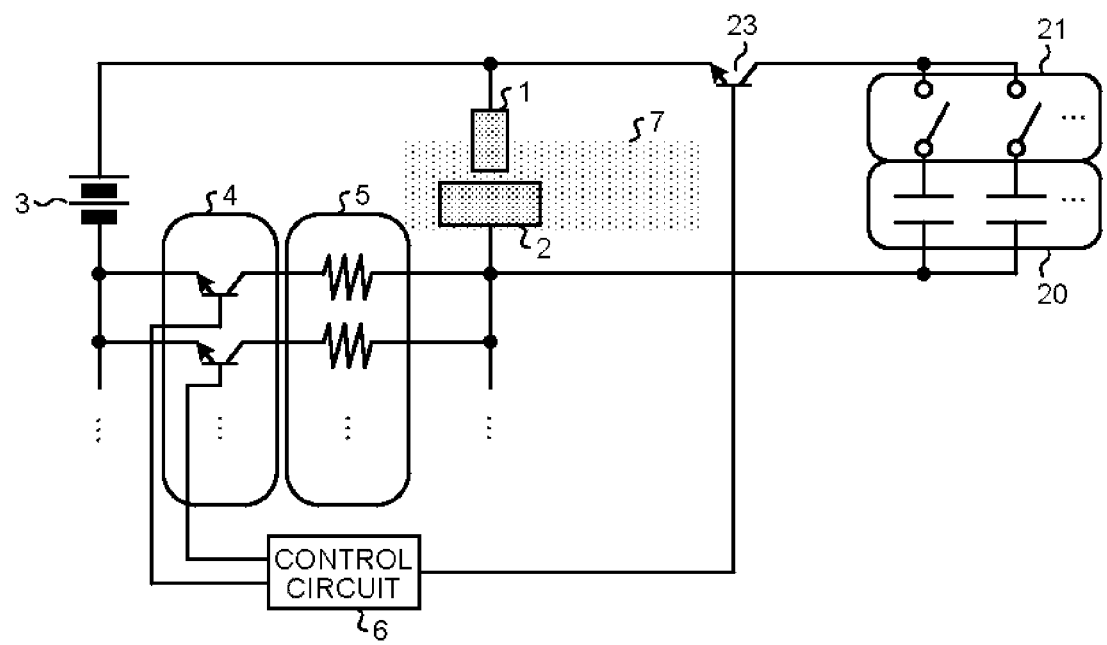
FIG. 8 is a circuit diagram illustrating a main portion configuration of a discharge surface treatment apparatus according to a fourth embodiment of the present invention.

FIG. 8 is a circuit diagram illustrating a main portion configuration of a discharge surface treatment apparatus according to the fourth embodiment of the present invention. In FIG. 8, components that are same as or similar to the components illustrated in FIG. 6 (third embodiment) are denoted by the same reference numerals. In this embodiment, the components related to the fourth embodiment are mainly explained.

In FIG. 8: a capacitor is connected in parallel with a discharge electrode and a workpiece which are arranged apart with a space at a certain interval; when forming a current portion having a high peak value and short pulse width in the leading portion of the discharge pulse current flowing between the poles, i.e., between the discharge electrode and the workpiece; as a circuit (fourth example) that can form a discharge pulse current into a current waveform that does not affect the formation of the film; in the configuration illustrated in FIG. 6 (third embodiment); a series circuit of a capacitor group 20 and a switch group 21 shown in FIG. 4 that constitute a variable capacitor is provided instead of the capacitor 8. The content and the method of turning on and off each switch of the switch group 21 are similar to the second embodiment. Other configurations are similar to that in FIG. 6.

Next, the operation of the components related to the fourth embodiment will be explained with reference to FIG. 2, FIG. 8, and FIG. 9. FIG. 9 is a waveform chart explaining the operation of the main portion configuration of the discharge surface treatment apparatus shown in FIG. 8. FIG. 9 illustrates (1) inter-pole voltage, (2) discharge current, (3) current from the power source 3, (4) current from the capacitor group 20, (5) timing of one or more switching elements of the switching element group 4, and (6) timing of the switching element 23.

When the control circuit 6 turns on one or more switching elements of the switching element group 4 in a state where any one of the switches of the switch group 21 is on and applies the output voltage of the power source 3 between the discharge electrode 1 and the workpiece 2, the control circuit 6 turns on the switching element 23 (FIG. 9 (5) and (6)). Then, the capacitor in the capacitor group 20 corresponding to the switch that is on in the switch group 21 is charged via the switching element 23.

When a discharge occurs, first, the leading pulse current 17 (FIG. 2) having a high peak value and short pulse width obtained by adding the current (FIG. 9 (4)) from one capacitor in the capacitor group 20 to the current (FIG. 9 (3)) supplied from the power source 3 flows between the poles, which is followed by the subsequent pulse current 18 (FIG. 2) having a low current value and long pulse width composed of only the current (FIG. 9 (3)) supplied from the power source 3.

Then, as explained in the third embodiment, because the timing at which the subsequent pulse current 18 starts flowing is known in advance, the control circuit 6 turns off the switching element 23 at that timing and keeps the switching element 23 off for an arbitrary short period of time (FIG. 9 (6)). Therefore, even if reversal of the current direction occurs in the capacitor that is performing a charge/discharge operation in the capacitor group 20, the reverse current is blocked by the switching element 23 that is turned off. Consequently, as shown in FIG. 9 (2) and (4), the problem that a portion in which the output current is low is generated in the current portion in which the current is switched from the leading pulse current 17 to the subsequent pulse current 18 does not occur. Moreover, the current value is prevented from being locally different in the leading current portion having a high peak value and short pulse width.

In other words, in a similar manner to the third embodiment, the discharge pulse current having an appropriate current waveform that does not affect the formation of the film can be supplied between the poles.

As explained in the third embodiment, in the period of the subsequent pulse current 18, in order to enable charging of the capacitor 8 to be performed for preparing for the next cycle, the control circuit 6 turns on the switching element 23 that is turned off after the lapse of an arbitrary period of time (FIG. 9 (6)) and keeps the switching element 23 on until turning off one or more switching elements of the switching element group 4 (FIG. 9 (5) and (6)). Consequently, the charging time of the capacitor that is performing a charge/discharge operation in the capacitor group 20 does not become long and thus sufficient charging can be completed in a short time.

In addition, in the fourth embodiment, the number of capacitors that perform a charge/discharge operation in the capacitor group 20 can be changed by changing the number of switches to be turned on in the switch group 21, therefore, the capacitance value of the capacitor connected in parallel with the discharge electrode 1 and the workpiece 2 can be changed.

In other words, as shown in FIG. 9 (2) and (4), the peak value of the leading pulse current 17 having a high peak value and short pulse width can be changed, therefore, when the discharge electrode 1 is hard, the peak current can be controlled so as to be high, and, when the discharge electrode 1 is soft, the peak current can be controlled so as to be low.

Therefore, in this fourth embodiment, the supply of an electrode material can be made appropriate so as to flexibly correspond to various electrodes. Thus, a dense film by various electrodes can be formed.

INDUSTRIAL APPLICABILITY

As described above, the discharge surface treatment apparatus according to the present invention is useful as a discharge surface treatment apparatus capable of forming the waveform of the entire discharge pulse current into a current waveform that does not affect the formation of the film when a capacitor is connected in parallel with a discharge electrode and a workpiece and a current portion having a high peak value and short pulse width is formed in the leading portion of the discharge pulse current that is generated between the poles.

REFERENCE SIGNS LIST 1 discharge electrode
2 workpiece
3 power source
4 switching element group
5 resistor group
6 control circuit
7 machining fluid
8 capacitor
9 resistor
10 diode
17 leading pulse current having a high peak value and short pulse width
18 subsequent pulse current having a low current value and long pulse width
20 capacitor group
21 switch group
23 switching element

The invention claimed is:
1. A discharge surface treatment apparatus that:
generates a pulsed discharge between poles comprising a discharge electrode and a workpiece, wherein the discharge electrode is obtained by compression-molding of any one of a metal powder, a powder of a metal compound, and a powder of ceramics or a mixture thereof; and forms a film made of an electrode material on a workpiece surface by thermal energy due to the discharge, the apparatus comprising:

a capacitor that is connected to any one of the discharge electrode and the workpiece at one end;

a switching element connected between a power supply and the workpiece;

a controller configured to turn on the switching element to apply a voltage between the poles and charge the capacitor with a power supplied from the power supply; and a parallel circuit of a resistor and a diode, which is provided between another one of the discharge electrode and the workpiece and another end of the capacitor via a connection line, wherein the capacitor is configured to generate a leading pulse current having a high peak value and a short pulse width; and the resistor is configured to suppress, and the diode is configured to block, a reverse current occurred in the capacitor from flowing toward the poles, when a subsequent current having a low current value and a long pulse width starts flowing between the poles.

2. The discharge surface treatment apparatus according to claim 1, wherein the capacitor is a variable capacitor.

3. The discharge surface treatment apparatus according to claim 2, wherein the variable capacitor includes:

a series circuit comprised of a capacitor group, in which a plurality of capacitors is arranged in parallel, and a switch group, in which switches are arranged in parallel, wherein a number of the switches is a same as a number of the plurality of capacitors.

4. The discharge surface treatment apparatus according to claim 1, wherein the controller is configured to control the switching element to stay on while the leading pulse current flows between the poles due to the power being supplied by the charged capacitor and while the subsequent current flows between the poles in response to the power of the capacitor being discharged.

5. A discharge surface treatment apparatus that:

generates a pulsed discharge between poles comprising a discharge electrode and a workpiece, wherein the discharge electrode is obtained by compression-molding of any one of a metal powder, a powder of a metal compound, and a powder of ceramics or a mixture thereof; and forms a film made of an electrode material on a workpiece surface by thermal energy due to the discharge, the apparatus comprising:

a capacitor that is connected to any one of the discharge electrode and the workpiece at one end;

a switching element provided between another one of the discharge electrode and the workpiece and another end of the capacitor via a connection line; and a controller that keeps the switching element on until a lapse of a predetermined time after occurrence of a discharge from when a voltage is applied between the poles, keeps the switching element off for an arbitrary period of time, and thereafter, keeps the switching element on for a period until voltage application between the poles ends, wherein the capacitor is configured to generate a leading pulse current having a high peak value and a short pulse width; and the switching element is configured to block a flow of a reverse current occurred in the capacitor from flowing toward the poles when a subsequent current having a low current value and a long pulse width starts flowing between the poles.

6. The discharge surface treatment apparatus according to claim 5, wherein the capacitor is a variable capacitor.

7. The discharge surface treatment apparatus according to claim 6, wherein the variable capacitor includes:

a series circuit comprised of a capacitor group, in which a plurality of capacitors is arranged in parallel, and a switch group, in which switches are arranged in parallel, wherein a number of the switches is a same as a number of the plurality of capacitors.

8. The discharge surface treatment apparatus according to claim 5, wherein the controller is configured to turn on the switching element to charge the capacitor with the power supplied from the power supply, control the switching element to stay on while the leading pulse current flows between the poles due to the power being supplied by the charged capacitor, and turn off the switching element for the arbitrary period of time just before the subsequent current starts flowing between the poles in response to the power of the capacitor being discharged thereby blocking the reverse current from flowing toward the poles.

* * * * *